US008762109B2

(12) United States Patent  
Christophersen et al.

(10) Patent No.: US 8,762,109 B2  
(45) Date of Patent: Jun. 24, 2014

(54) CROSSTALK COMPENSATION IN ANALYSIS OF ENERGY STORAGE DEVICES

(75) Inventors: Jon P. Christophersen, Idaho Falls, ID (US); John L. Morrison, Butte, MT (US); William H. Morrison, Manchester, CT (US); Chester G. Motloch, Idaho Falls, ID (US); David M. Rose, Mountlake Terrace, WA (US)

(73) Assignee: Battelle Energy Alliance, LLC, Idaho Falls, ID (US)

( * ) Notice: Subject to any disclaimer, the term of this patent is extended or adjusted under 35 U.S.C. 154(b) by 532 days.

(21) Appl. No.: 13/100,184

(22) Filed: May 3, 2011

(65) Prior Publication Data

US 2012/0032688 A1 Feb. 9, 2012

Related U.S. Application Data

(60) Provisional application No. 61/330,733, filed on May 3, 2010.

(51) Int. Cl.  
*H04B 15/00* (2006.01)

(52) U.S. Cl.  
USPC .................. 702/196; 702/57; 702/66; 702/69; 702/189; 702/191

(58) Field of Classification Search  
USPC ........ 702/57, 66, 69, 189, 191, 196; 324/600, 324/602–603, 613, 620, 622  
See application file for complete search history.

(56) References Cited

U.S. PATENT DOCUMENTS

| | | |
|---|---|---|
| 5,061,890 A | 10/1991 | Longini |
| 5,261,007 A | 11/1993 | Hirsch |
| 5,406,496 A | 4/1995 | Quinn |
| 5,454,377 A | 10/1995 | Dzwonczyk et al. |
| 5,512,832 A | 4/1996 | Russell et al. |
| 5,946,482 A | 8/1999 | Barford et al. |
| 6,160,382 A | 12/2000 | Yoon et al. |
| 6,208,147 B1 | 3/2001 | Yoon et al. |
| 6,249,186 B1 | 6/2001 | Ebihara et al. |
| 6,262,563 B1 | 7/2001 | Champlin |

(Continued)

FOREIGN PATENT DOCUMENTS

JP 2000-009817 A 1/2000

OTHER PUBLICATIONS

PCT International Search Report and Written Opinion of the International Searching Authority for PCT/US11/35052, dated Jul. 26, 2011, 11 pages.

(Continued)

*Primary Examiner* — Mischita Henson  
(74) *Attorney, Agent, or Firm* — TraskBritt

(57) ABSTRACT

Estimating impedance of energy storage devices includes generating input signals at various frequencies with a frequency step factor therebetween. An excitation time record (ETR) is generated to include a summation of the input signals and a deviation matrix of coefficients is generated relative to the excitation time record to determine crosstalk between the input signals. An energy storage device is stimulated with the ETR and simultaneously a response time record (RTR) is captured that is indicative of a response of the energy storage device to the ETR. The deviation matrix is applied to the RTR to determine an in-phase component and a quadrature component of an impedance of the energy storage device at each of the different frequencies with the crosstalk between the input signals substantially removed. This approach enables rapid impedance spectra measurements that can be completed within one period of the lowest frequency or less.

34 Claims, 8 Drawing Sheets

(56) References Cited

U.S. PATENT DOCUMENTS

| | | | |
|---|---|---|---|
| 6,307,378 | B1 | 10/2001 | Kozlowski |
| 6,481,289 | B2 | 11/2002 | Dixon et al. |
| 6,653,817 | B2 | 11/2003 | Tate, Jr. et al. |
| 6,832,171 | B2 | 12/2004 | Barsoukov et al. |
| 7,065,474 | B2 | 6/2006 | Petchenev et al. |
| 7,395,163 | B1 | 7/2008 | Morrison et al. |
| 7,616,003 | B2 | 11/2009 | Satoh et al. |
| 7,675,293 | B2 | 3/2010 | Christophersen et al. |
| 2002/0065621 | A1 | 5/2002 | Jungerman |
| 2003/0206021 | A1 | 11/2003 | Laletin et al. |
| 2005/0127908 | A1 | 6/2005 | Schlicker et al. |
| 2005/0182584 | A1 | 8/2005 | Plusquellic |
| 2007/0257681 | A1 | 11/2007 | Christophersen et al. |
| 2008/0303528 | A1 | 12/2008 | Kim |
| 2009/0076752 | A1 | 3/2009 | Wang et al. |
| 2010/0010762 | A1 | 1/2010 | Seki |
| 2010/0274510 | A1 | 10/2010 | Morrison et al. |
| 2010/0332165 | A1 | 12/2010 | Morrison et al. |

OTHER PUBLICATIONS

Ramos et al., Comparison of impedance measurements in a DSP using ellipse-fit and seven-parameter sine-fit algorithms, Measurement 42 (May 23, 2009) pp. 1370-1379. Retrieved online at <http://www.sciencedirect.com/science/article/pii/S0263224109001031>.

Ranade et al., An overview of harmonics modeling and simulation, Elect. Power Syst. Res., vol. 74, pp. 37-56, Apr. 2005, Retrieved online at <http://www.calvin.edu/~pribeiro/IEEE/ieee_cd/chapters/pdffiles/c1pdf.pdf>.

Albreht, Weston, "Battery Complex Impedance Identification with Random Signal Techniques," May 4, 2005, Montana Tech of the University of Montana, 99 pages.

Alpaydin, Ethem, "Radial Basis Functions," 2004, Chapter 12.3, pp. 284-290, Introduction to Machine Learning, The MIT Press, Cambridge, Massachusetts, London, England.

Chapra, "Numerical Methods for Engineers," pp. 394-398, McGraw-Hill Publishing Company, 1985.

Christophersen et al., "Effects of Reference Performance Testing during Aging Using Commercial Lithium-ion Cells," J. Electrochem Soc., 153(7) 2006, pp. A2406-A1416.

Christophersen et al., Electrochemical Impedance Spectroscopy Testing on the Advanced Technology Development Program Lithium-ion Cells, 2002, IEEE Trans. Veh. Technol., pp. 1851-1855, 56(3).

Christophersen et al., "Lumped Parameter Modeling as a Predictive Tool for a Battery Status Monitor," Oct. 2003, Proceedings from IEEE Vehicular Technology Conference, 6 pages.

Christophersen, Jon P., "Impedance Noise Identification for State-of-Health Prognostics," Jul. 7-10, 2008, Philadelphia, PA, 43rd Power Sources Conference, 4 pages.

Fenton et al., "BSM Development Documentation Senior Project Final Report for the Idaho National Laboratory," May 2005, Montana Tech of the University of Montana, 21 pages.

"FreedomCAR Battery Test Manual for Power-Assist Hybrid Electric Vehicles," manual, Oct. 2003, Appendix D, DOE/ID-11069, Idaho National Laboratory, 130 pages.

Mix, Dwight F., "Random Signal Processing," p. 296, Prentice Hall Publishing Company, 1995.

Morrison et al., "Fast Summation Transformation for Battery Impedance Identification," IEEE Aerospace 2009 Conference, Mar. 7-14, 2009, Big Sky, Montana, 9 pages.

Morrison et al., "Real Time Estimation of Battery Impedance," Proceedings from the IEEE Aerospace Conference, Mar. 5-11, 2006, Big Sky, MT, 13 pages.

Morrison, William H., "Intelligent Self-Evolving Prognostic Fusion, Phase I STTR Interim Report," Jul. 29, 2005, Qualtech Systems, Inc., NASA, Ames Research Center, 23 pages.

Nikolopoulos et al., "Accurate Method of Representation of High-Voltage Measuring Systems and its Application in High-Impulse-Voltage Measurements," Mar. 1989, IEEE, vol. 136, Issue 2, pp. 66-72, Science, Measurement and Technology, IEEE Proceedings A, Dept. of Electr. Eng., Nat. Tech. Univ., Athens, Greece.

PCT International Search Report and Written Opinion of the International Searching Authority for PCT/US2010/038401, dated Dec. 31, 2010, 8 pages.

PCT International Search Report and Written Opinion of the International Searching Authority for PCT/US2010/038358, dated Dec. 31, 2010, 8 pages.

Smith et al., "Model Validation Approaches for Nonlinear Feedback Systems Using Frequency Response Measurements," Dec. 7-10, 1999, 1500-1504, vol. 2, IEEE, Proceedings of the 38th IEEE Conference on Decision and Control, Phoenix, AZ.

Smyth, Brian, "Development of a Real Time Battery Impedance Measuring System," M.S. Thesis Montana Tech of the University of Montana, 2008, 128 pages.

U.S. Appl. No. 12/217,013, filed Jun. 30, 2008 to Morrison et al., titled, "Method of Detecting System Function by Measuring Frequency Response."

U.S. Appl. No. 13/100,170, filed May 3, 2011 to Christophersen et al., titled, "In-Situ Real-Time Energy Storage Device Impedance Identification."

Wasserman, Philip D., "Radial Basis-Function Networks," Chapter 8, pp. 147-176, Advanced Methods in Neural Computing, 1993, New York: Van Nostrand Reinhold.

Ziemer et al., "Signals and Linear Systems," 2002, Chapter 2, pp. 56-123, Principles of Communications, 5th edition, John Wiley & Sons.

Brigham, "The Fast Fourier Transform", 1974, Prentice-Hall, Chapter 4 pp. 50-74, Chapter 13 pp. 198-223.

Brigham, "The Fast Fourier Transform," 1974, Prentice-Hall, Chapter 1 pp. 1-10.

Brigham, "The Fast Fourier Transform," 1974, Prentice Hall, Chapter 7 pp. 110-122.

CROSSTALK COMPENSATION IN ANALYSIS OF ENERGY STORAGE DEVICES

CROSS-REFERENCE TO RELATED APPLICATION

This application claims the benefit of U.S. Provisional Patent Application Ser. No. 61/330,733, filed May 3, 2010, the disclosure of which is hereby incorporated herein in its entirety by this reference.

STATEMENT REGARDING FEDERALLY SPONSORED RESEARCH AND DEVELOPMENT

This invention was made with government support under Contract No. DE-AC07-05ID14517 awarded by the United States Department of Energy. The government has certain rights in the invention.

TECHNICAL FIELD

Embodiments of the present disclosure relate generally to determining parameters of energy storage devices and, more specifically, to determining impedance and output characteristics of energy storage devices.

BACKGROUND

All patents, patent applications, and publications referred to or cited herein, are incorporated by reference in their entirety.

Electrical energy storage devices (e.g., batteries, fuel cells, ultracapacitors, etc.) have become important subsystems for many military, space and commercial applications. Consequently, in-situ diagnostics for accurate state-of-health estimations have also gained significant interest. For many applications, however, it is insufficient to monitor simple parameters such as voltage, current, and temperature to gauge the remaining capacity of the energy storage device. Knowledge of impedance and power capability also may be necessary for an accurate state-of-health estimation. An important component of in-situ impedance monitoring is rapid measurements that minimally perturb the energy storage device.

Advanced techniques for real-time assessment of the impedance spectra for energy storage devices have been proposed. Many of these techniques can be implemented in an embedded device and periodically query the energy storage device to determine its state-of-health. For example, it has been shown that a shift in the impedance spectra of battery technologies strongly correlates to the corresponding pulse resistance and power capability.

One technique, referred to herein as Impedance Noise Identification (INI), disclosed in U.S. Pat. No. 7,675,293 to Christophersen et al., uses a random signal excitation covering a frequency range of interest and monitors a response. The input and response signals may be cross-correlated, normalized by an auto-correlated input signal, and then averaged and converted to the frequency domain through Fast Fourier Transforms. INI can be implemented on an embedded system and yield high-resolution data.

Another technique, referred to herein as Compensated Synchronous Detection (CSD), disclosed in U.S. Pat. No. 7,395,163 to Morrison et al., uses a Sum-of-Sines (SOS) input signal that adequately covers a frequency range of interest. The magnitude and phase at each frequency of the response signal is initially determined through synchronous detection. However, these data may be tainted by crosstalk error, so the response signal is reassembled with all the frequencies except the one of interest, and then subtracted from the original response signal and synchronously detected again. Generally, CSD may be more rapid than INI, but it may need three periods of the lowest frequency, and trades off resolution for speed of measurement.

Yet another technique, referred to herein as Fast Summation Transformation (FST), disclosed in U.S. patent application Ser. No. 12/217,013, now U.S. Pat. No. 8,150,643, issued Apr. 3, 2012, to Morrison et al., also uses an SOS input signal that covers a frequency range of interest. However, to eliminate the crosstalk error, the frequency is increased in octave harmonic steps. Thus, no compensation is required and the response signal can simply be rectified relative to the sine and the cosine to establish the impedance spectra. Some attributes of FST are that it only requires a time record of acquired data covering one period of the lowest frequency, and the data processing algorithm is very simple. However, with FST the resolution in frequencies cannot be any finer than octave steps.

The inventors have appreciated that a need remains for an approach to analyzing energy storage devices that requires a time record duration of only one period of the lowest frequency or less, but can perform with a higher frequency resolution and more flexible frequency selection than octave steps and harmonic frequency steps.

BRIEF SUMMARY

Embodiments of the present disclosure include apparatuses, methods, and computer-readable media for analyzing energy storage devices that use a sum-of-sines stimulus signal and require a time record duration of one period or less of the lowest frequency, but can perform with a higher frequency resolution and more flexible frequency selection than octave steps and harmonic frequency steps.

In accordance with an embodiment of the present disclosure, a method of estimating an impedance of an energy storage device includes generating two or more input signals at different frequencies with a frequency step factor therebetween. The method also includes generating an excitation time record comprising a summation of the two or more input signals and generating a deviation matrix of coefficients relative to parameters of the excitation time record to determine a crosstalk between the two or more input signal. An energy storage device is stimulated with the excitation time record and substantially simultaneously a response time record is captured that is indicative of a response of the energy storage device to the excitation time record. The deviation matrix of coefficients is applied to the response time record to determine response signals including an in-phase component and a quadrature component of the impedance of the energy storage device at each of the different frequencies with the crosstalk between the response signals substantially removed.

In accordance with another embodiment of the present disclosure, an apparatus for characterizing an energy storage device includes a signal generator configured for stimulating an energy storage device with a stimulus signal generated responsive to an excitation time record. A response measurement device is configured for measuring a response signal substantially simultaneously when the stimulus signal is applied to the energy storage device, wherein the response signal is indicative of a response of the energy storage device to the stimulus signal. An analyzer operably coupled to the stimulus signal and the response signal is configured for generating two or more input signals at different frequencies with a frequency step factor therebetween. The analyzer is also configured for generating the excitation time record comprising a summation of the two or more input signals and generating a deviation matrix of coefficients relative to parameters of the excitation time record to determine a crosstalk between the two or more input signals. The analyzer is also configured for sampling the response signal to generate a response time record and applying the deviation matrix of coefficients to the response time record to determine response signals including an in-phase component and a quadrature component of the impedance of the energy storage device at each of the different frequencies with the crosstalk between response signals substantially removed.

In accordance with yet another embodiment of the present disclosure, computer-readable media include computer-executable instructions, which when executed on one or more computers, cause the computers to generate two or more input signals at different frequencies with a frequency step factor therebetween and generate an excitation time record comprising a summation of the two or more input signals. The instructions also cause the computers to generate a deviation matrix of coefficients relative to parameters of the excitation time record to determine a crosstalk between the two or more input signals and stimulate an energy storage device with the excitation time record and substantially simultaneously capture a response time record indicative of a response of the energy storage device to the excitation time record. The instructions also cause the computers to apply the deviation matrix of coefficients to the response time record to determine response signals including an in-phase component and a quadrature component of the impedance of the energy storage device at each of the different frequencies with the crosstalk between the response signals substantially removed.

DETAILED DESCRIPTION

Figure 1:
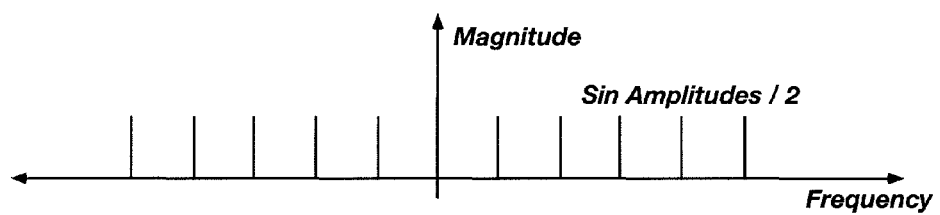
FIG. 1 illustrates an ideal frequency spectrum for a Sum-of-Sines (SOS) stimulus signal.

In the following description, reference is made to the accompanying drawings that form a part hereof, and in which is shown, by way of illustration, specific embodiments in which the disclosure may be practiced. The embodiments are intended to describe aspects of the disclosure in sufficient detail to enable those skilled in the art to practice the invention. Other embodiments may be utilized and changes may be made without departing from the scope of the disclosure. The following detailed description is not to be taken in a limiting sense, and the scope of the present invention is defined only by the appended claims.

Furthermore, specific implementations shown and described are only examples and should not be construed as the only way to implement the present disclosure unless specified otherwise herein. It will be readily apparent to one of ordinary skill in the art that the various embodiments of the present disclosure may be practiced by numerous other partitioning solutions.

In the following description, elements, circuits, and functions may be shown in block diagram form in order not to obscure the present disclosure in unnecessary detail. Conversely, specific implementations shown and described are exemplary only and should not be construed as the only way to implement the present disclosure unless specified otherwise herein. Additionally, block definitions and partitioning of logic between various blocks is exemplary of a specific implementation. It will be readily apparent to one of ordinary skill in the art that the present disclosure may be practiced by numerous other partitioning solutions. For the most part, details concerning timing considerations and the like have been omitted where such details are not necessary to obtain a complete understanding of the present disclosure and are within the abilities of persons of ordinary skill in the relevant art.

Those of ordinary skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof. Some drawings may illustrate signals as a single signal for clarity of presentation and description. It will be understood by a person of ordinary skill in the art that the signal may represent a bus of signals, wherein the bus may have a variety of bit widths and the present disclosure may be implemented on any number of data signals including a single data signal.

The various illustrative logical blocks, modules, and circuits described in connection with the embodiments disclosed herein may be implemented or performed with a general purpose processor, a special purpose processor, a Digital Signal Processor (DSP), an Application Specific Integrated Circuit (ASIC), a Field Programmable Gate Array (FPGA) or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

Also, it is noted that the embodiments may be described in terms of a process that is depicted as a flowchart, a flow diagram, a structure diagram, or a block diagram. Although a flowchart may describe operational acts as a sequential process, many of these acts can be performed in another sequence, in parallel, or substantially concurrently. In addition, the order of the acts may be re-arranged. A process may correspond to a method, a function, a procedure, a subroutine, a subprogram, etc. Furthermore, the methods disclosed herein may be implemented in hardware, software, or both. If implemented in software, the functions may be stored or transmitted as one or more instructions or code on computer-readable media. Computer-readable media includes both computer storage media and communication media including any medium that facilitates transfer of a computer program from one place to another.

It should be understood that any reference to an element herein using a designation such as "first," "second," and so forth does not limit the quantity or order of those elements, unless such limitation is explicitly stated. Rather, these designations may be used herein as a convenient method of distinguishing between two or more elements or instances of an element. Thus, a reference to first and second elements does not mean that only two elements may be employed there or that the first element must precede the second element in some manner. In addition, unless stated otherwise a set of elements may comprise one or more elements.

Elements described herein may include multiple instances of the same element. These elements may be generically indicated by a numerical designator (e.g. 110) and specifically indicated by the numerical indicator followed by an alphabetic designator (e.g., 110A) or a numeric indicator preceded by a "dash" (e.g., 110-1). For ease of following the description, for the most part element number indicators begin with the number of the drawing on which the elements are introduced or most fully discussed. Thus, for example, element identifiers on a FIG. 1 will be mostly in the numerical format 1xx and elements on a FIG. 4 will be mostly in the numerical format 4xx.

Headings are included herein to aid in locating certain sections of detailed description. These headings should not be considered to limit the scope of the concepts described under any specific heading. Furthermore, concepts described in any specific heading are generally applicable in other sections throughout the entire specification.

Embodiments of the present disclosure include apparatuses, methods, and computer-readable media for analyzing energy storage devices that use a sum-of-sines stimulus signal and require a time record duration of one period or less of the lowest frequency, but can perform with a higher frequency resolution and more flexible frequency selection than octave steps and harmonic frequency steps.

Embodiments of the present disclosure use a methodology, referred to herein as CrossTalk Compensation (CTC), for obtaining high-resolution impedance spectra for energy storage devices (e.g., batteries) within one period or less of the lowest frequency of a Sum-of-Sines (SOS) stimulus signal. Unlike the FST method discussed above, embodiments of the present disclosure are not limited to octave harmonic increases in frequency or even generally to harmonic frequencies. Instead, the SOS signal can include sinusoids that increase from the lowest frequency of interest by any step factor greater than one, thereby significantly increasing the measurement resolution.

Conceptually, a CTC method attempts to remove the restriction to harmonic frequencies of other rapid techniques, and this allows the ability to pick and choose which frequencies a test is going to measure. For example, to obtain a general scattering of data throughout the frequency spectrum for a baseline, and also wanted higher-resolution data around a particular characteristic, this CTC would allow for these data to be acquired in one period of the lowest frequency or less. One such characteristic that might interest a researcher is the impedance trough used to track the power fade and state of health of a battery.

FIG. 1 illustrates an ideal frequency spectrum for a Sum-of-Sines (SOS) stimulus signal. The ideal SOS stimulus signal of infinite duration transforms to the frequency domain into a picket fence of impulses at each present frequency as seen in FIG. 1.

Figure 2:
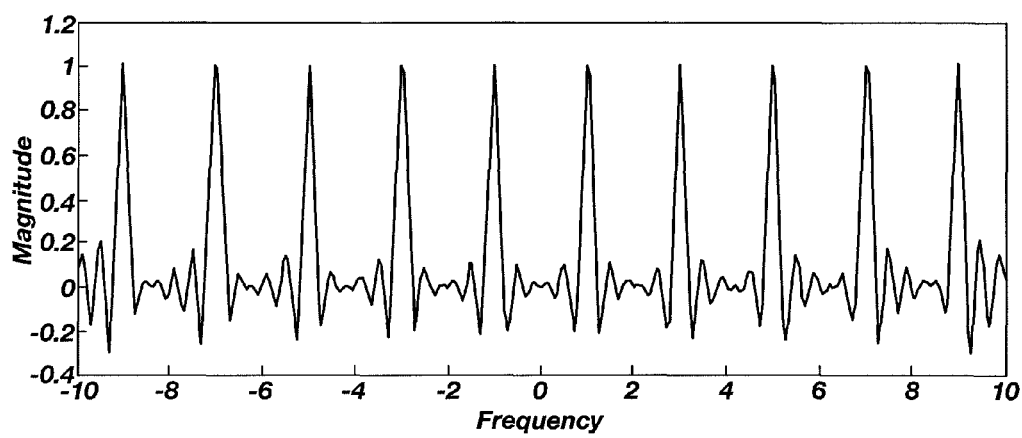
FIG. 2 illustrates an actual frequency spectrum for an SOS stimulus signal with a finite time record.

FIG. 2 illustrates an actual frequency spectrum for an SOS stimulus signal for a finite time record. Because a time record for an SOS stimulus signal is not infinitely long, the frequency spectrum becomes a sum of overlapping sinc functions such that, at each frequency of interest, the overall response is made up of the response of interest plus the tails of all of the other non-harmonic frequencies present in the signal. Thus, as referred to herein, crosstalk is the interference of non-harmonic frequencies between sine waves in an SOS stimulus signal.

In techniques such as CSD and FST discussed above, frequencies are chosen that are harmonically related to each other so that at each frequency of interest, all other sinc functions have a zero crossing in the frequency domain. Because the other frequencies present have a zero magnitude, only the response of interest remains. In other words, harmonic frequencies have zero crosstalk.

The need to select harmonics also causes a low resolution of frequencies in methods such as CSD and FST. For example, given a range of 0.1 Hz to 2000 Hz; only fifteen octave harmonic frequencies can be used with the highest frequency being 1638.4 Hz. Therefore, if a method is to fit more than fifteen frequencies in that range, it will need to deal with the effects of crosstalk. A CTC method allows a choice of any set of frequencies because it will remove the effect of crosstalk from the results. This removal will yield a much higher resolution in frequency without sacrificing the speed of measurement.

A general system for use in employing CTC methods is first discussed. This is followed by a general description of the CTC method and development of the excitation time record. The CTC analysis of the response time record can be implemented in either the time domain or frequency domain. Mathematical descriptions using both the time and frequency domains are also provided herein.

Figure 3:
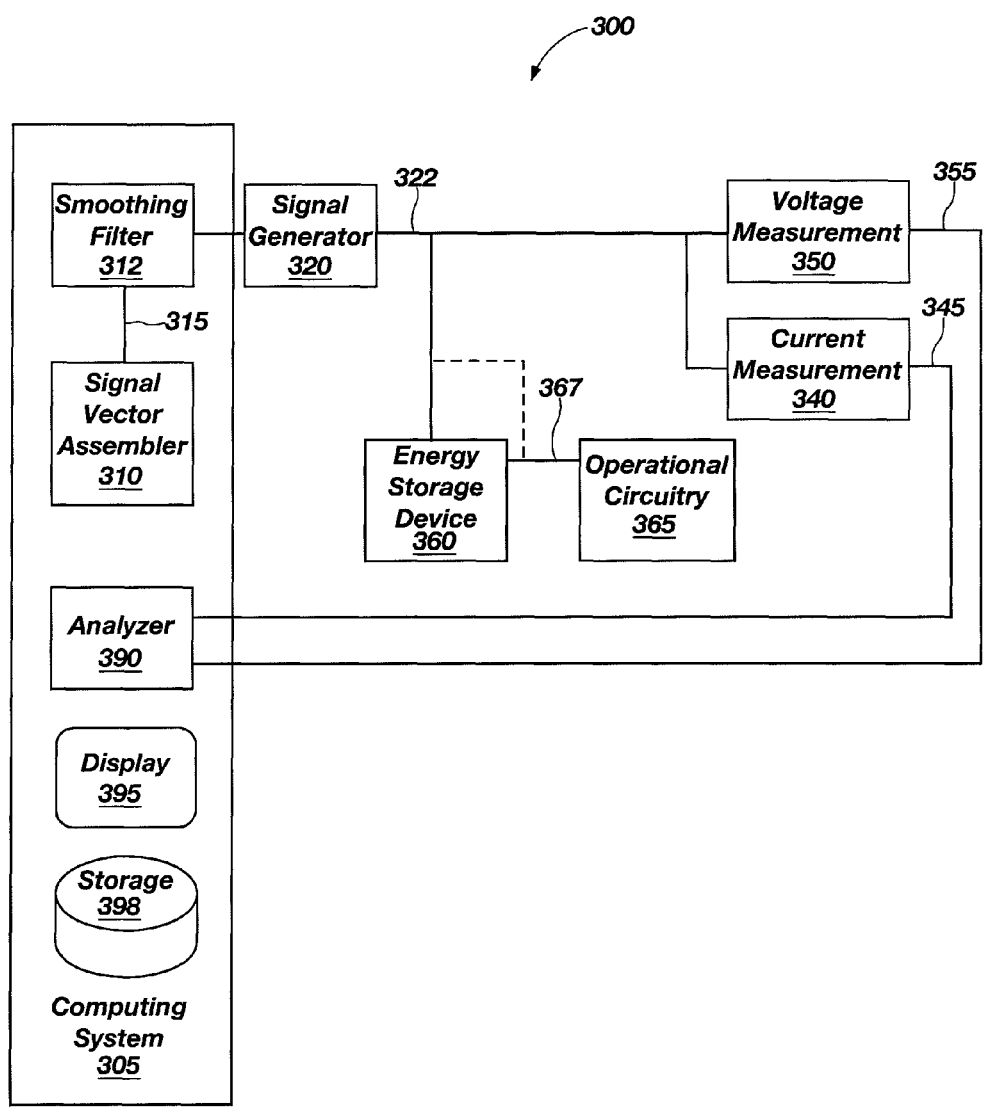
FIG. 3 is a simplified block diagram of a system for in-situ measurements of energy storage devices according to one or more embodiments of the present disclosure.

FIG. 3 is a simplified block diagram of a system for in-situ measurements of energy storage devices according to one or more embodiments of the present disclosure. FIG. 3 illustrates an impedance analysis system 300 for characterizing an energy storage device 360 according to the present invention. The impedance analysis system 300 includes a signal vector assembler 310 for generating a signal vector 315 and may also include a smoothing filter 312 for smoothing and modifying the signal vector 315. The signal vector 315 is an SOS signal as described below. For application to an energy storage device (ESD) 360, a signal generator 320 converts the signal vector 315 to a stimulus signal 322, which may be a current source signal or a voltage source signal suitable for application to a terminal of the energy storage device 360. The energy storage device 360 generally may be connected to the stimulus signal 322 and the other terminal may be coupled to a ground.

The energy storage device 360 may be coupled to operational circuitry 365 via connection 367. The operational circuitry 365 represents any loads configured to be driven by the energy storage device 360 that may discharge the energy storage device 360, as well as any charging circuitry for restoring charge to the energy storage device 360. The impedance analysis system 300 may be configured for in-situ operation. As such, the stimulus signal 322 may be coupled to the energy storage device for performing impedance analysis during normal operation of the operational circuitry 365.

In some systems, according to the present disclosure, the signal vector assembler 310, filter 312, and an analyzer 390 may be discrete elements targeted at their specific function. However, in other systems according to the present disclosure, these functions may be included in a computing system 305. Thus, the computing system 305 may include software for performing the functions of assembling signal vectors, digital filtering, and analyzing various input signals relative to the signal vector to determine impedance of the energy storage device 360. In still other systems, some of these functions may be performed with dedicated hardware and others may be performed with software.

In addition, the computing system 305 may include a display 395 for presenting control selection operations and data in a format useful for interpreting impedance characteristics of the energy storage device 360. The display 395 may also be used for presenting more general battery characteristics of interest, such as, for example, state-of-charge or state-of-health. A computing system 305 may also include storage 398 for storing sampled information from any of the processes described below as well as for containing computing instructions for execution by the analyzer 390 to carry out the processes described below.

The signal vector assembler 310 may be any suitable apparatus or software for generating the signal vector 315 with an average amplitude substantially near zero. The signal vector assembler 310 may be configured as digital logic or as computer instructions for execution on the computing system 305. The smoothing filter 312 may be a bandpass filter or a low-pass filter used for smoothing the signal vector 315 by removing high frequencies, low frequencies, or a combination thereof to present an analog signal more suitable for application to the energy storage device 360. The smoothing filter 312 may include a digital filter configured as digital logic or as computer instruction for execution on the computing system 305. The smoothing filter 312 also may include an analog filter configured as analog elements. Finally, the smoothing filter 312 may include a digital filter and an analog filter in combination.

The actual current, at the energy storage device 360 as a result of the stimulus signal 322, may be determined by a current measurement device 340 coupled to the stimulus signal 322 and configured to generate a measured current response 345.

The actual voltage, at the energy storage device 360 as a result of the stimulus signal 322, may be determined by a voltage measurement device 350 and configured to generate a measured voltage response 355.

The measured voltage response 355 and the measured current response 345 may be operably coupled to the analyzer 390. The analyzer 390 is configured for periodically sampling signals that may be analog input signals and converting them to digital data to create records of a time-varying response signals. The time-varying response signals may be used by the analyzer 390 for determining impedance characteristics of the energy storage device 360, as is discussed more fully below.

Further details of an impedance analysis system 300, which may be useful with embodiments of the present disclosure may be found in U.S. patent application Ser. No. 13/100,184, to Christophersen et al., entitled "IN-SITU REAL-TIME ENERGY STORAGE DEVICE IMPEDANCE IDENTIFICATION," which is filed concurrently with the present application and for which the contents are incorporated herein in its entirety.

Figure 4:
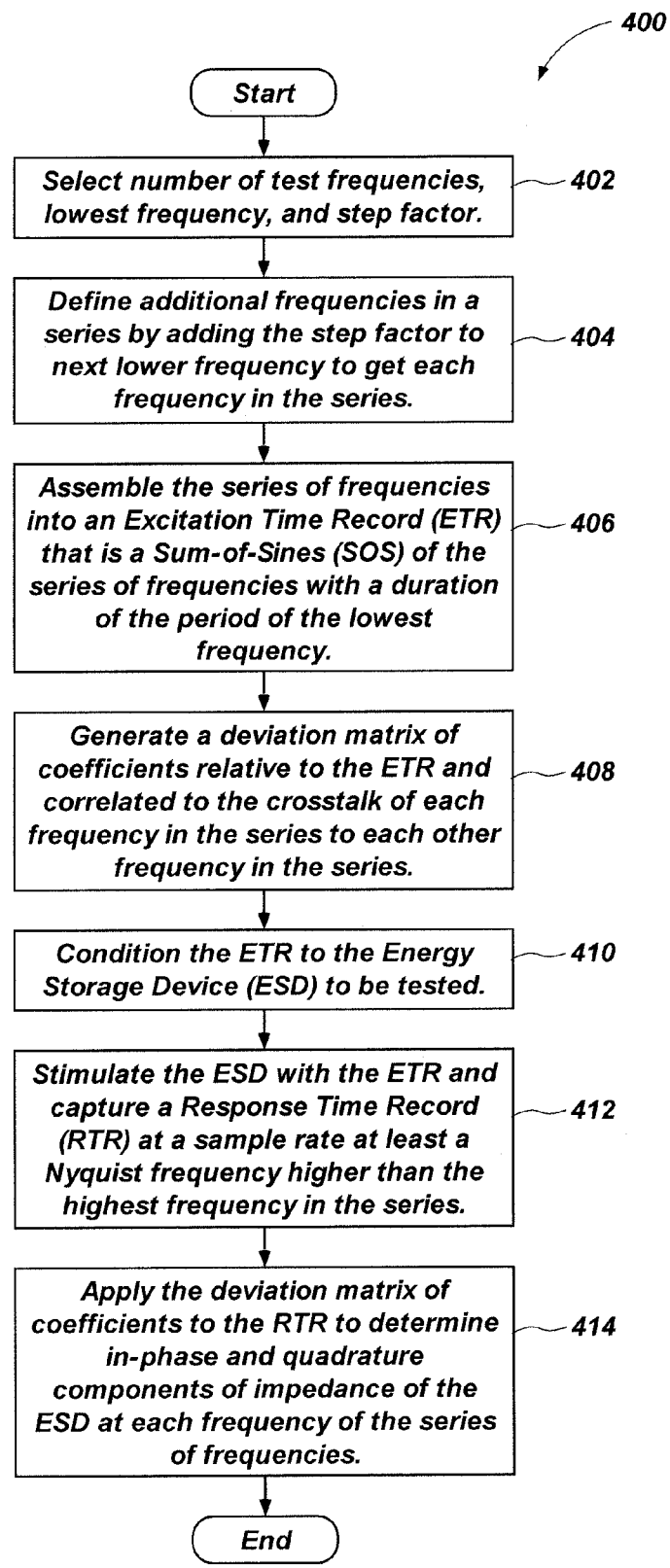
FIG. 4 is a simplified flow diagram of a crosstalk compensation (CTC) method according to one or more embodiments of the present disclosure.

FIG. 4 is a simplified flow diagram of a CTC method 400 according to one or more embodiments of the present disclosure. In operation block 402 a number of test frequencies is selected based on a lowest frequency of interest and a step factor. The step factor is chosen to be greater than one and generally chosen to be a non-integer to create a series of frequencies that are non-harmonic. Selecting an integer step factor to create harmonic frequencies is possible but much of the CTC methods may be redundant since harmonic frequencies will generate no crosstalk.

However, the use of a CTC using harmonic frequencies may be useful when the operational circuitry 365 contains noise that is injected into the ESD 360 through the connection 367. In such an embodiment, noise that may be present at the ESD 360 may be sampled by the impedance analysis system 300, estimated analytically, or a combination thereof. The noise information may then be incorporated into the deviation matrix of coefficients, which is explained below. As a result, when a response time record (also explained below) is captured, application of the deviation matrix of coefficients to the response time record will remove the previously determined noise components to yield noise corrected in-phase and quadrature components of the impedance of the ESD 360.

With the lowest frequency defined, operation block 404 indicates that each additional frequency is defined as the step factor higher than the next lower frequency. For example, with a lowest frequency of 1 Hz, a step factor of 1.5 and a total of five frequencies in the series, the series of frequencies would be 1, 1.5, 3.0, 4.5, and 6 Hz.

Operation block 406 indicates that sinusoid waveforms of the frequencies in the series are summed to obtain an Excitation Time Record (ETR) that includes a sum-of-sines of the series of frequencies with a duration of one period of the lowest frequency (e.g., a one second duration given a low frequency of 1 Hz in the example above).

Operation block 408 indicates that the SOS is evaluated to generate a deviation matrix of coefficients relative to the ETR and correlated to the crosstalk of each frequency in the series to each other frequency in the series. Thus, this deviation matrix is indicative of how crosstalk from any one frequency in the series affects any other frequency in the series.

Operation block 410 indicates that the ETR may be conditioned (e.g., filtered), as described above, to create a signal suitable for the type of system and energy storage device in use.

Operation block 412 indicates that the energy storage device is stimulated with the ETR and a Response Time Record (RTR) is captured at substantially the same time as the ETR is applied. The sampling rate should be at a high enough frequency so as to avoid aliasing errors (e.g., at least twice the highest frequency). Moreover, it may be advisable to use a sampling rate that is at least three times the highest frequency in the SOS signal.

Operation block 414 indicates that the deviation matrix of coefficients is applied to the RTR to determine in-phase and quadrature components of impedance of the ESD at each frequency of the series of frequencies. While not illustrated, these in-phase and quadrature components can be further analyzed to arrive at magnitude and phase for each frequency of the series.

Significantly, the deviation matrix does not depend on the response of the energy storage device. As a result, the deviation matrix may be determined before, during, or after the time period when the ETR is applied to the energy storage device. Therefore, while computing the deviation matrix may be computationally intensive (depending on the step factor and number of frequencies), it can be done out of the time line of stimulating the energy storage device and acquiring the response of the energy storage device.

1.0 CTC Algorithm Description

With reference to FIG. 1, an excitation time record includes an SOS signal whose lowest frequency, frequency step factor (S), and total number of frequencies included in the signal (M), are known. The excitation time record (e.g., the signal vector 315 in FIG. 3) may be applied to the energy storage device 360 by the signal generator 320. The energy storage device 360 responds to the stimulus signal 322, and the resulting RTR is captured with a sample period that is compatible with Nyquist constraints. It is assumed that the captured time record has a duration of N discrete points.

A CTC algorithm includes a finite SOS input signal and a captured response from an ESD. The response is processed using constants and parameters associated with the signal (duration, frequencies of interest, etc.) to yield the real and imaginary components of the signal's frequency spectrum at each discrete frequency of interest.

Consider a RTR that includes a sum of phase shifted sine waves in discrete time, as shown in Equation (1):

$$y(n) = \sum_{i=1}^{M} A_i \sin\left(\frac{2\pi}{T_i} n \Delta t + \varphi_i\right) \quad (1)$$

Where:
$A_i$ is the unknown amplitude at the $i^{th}$ frequency
$\phi_i$ is the unknown phase shift at the $i^{th}$ frequency
n is the discrete time step integer (a total of N discrete points)
$\Delta t$ is the sample time step
M is the number of frequencies
$T_i$ is the period of the $i^{th}$ frequency Note that y(n) for n=0, 1, 2, 3, . . . N is the measured response obtained by sending a current signal through an ESD and sampling its voltage response.

Equation (1) may be converted into its in-phase and quadrature components using the trigonometric identity of $\sin(\alpha+\beta)=\sin(\alpha)\cos(\beta)+\cos(\alpha)\sin(\beta)$, as shown in Equation (2):

$$y(n) = \sum_{i=1}^{M} a_i \sin\left(\frac{2\pi}{T_i} n \Delta t\right) + b_i \cos\left(\frac{2\pi}{T_i} n \Delta t\right) \quad (2)$$

Where: $a_i = A_i \cos(\phi_i)$ and $b_i = A_i \sin(\phi_i)$

Equation (2) forms the basis of an SOS signal that may be analyzed to determine a deviation matrix in either the time domain or the frequency domain.

1.1 Time Domain CTC Algorithm

For the time domain CTC algorithm, Equation (2) is assumed to fit every point of the captured time record and this results in an over-determined system of equations. Therefore, the CTC analysis takes the form of a least squares solution that minimizes the squared error terms. A pseudoinverse matrix is used to get a solution for all $a_i$, $b_i$ in Equation (2). If this equation is rewritten in matrix multiplication form, it becomes Equation (3). Expanding Equation (3) for each value of n from 1 to N (i.e., each datum in the time record) yields Equation (4).

$$y(n) = \left[\sin\left(\frac{2\pi}{T_1} n \Delta t\right), \sin\left(\frac{2\pi}{T_2} n \Delta t\right), \ldots \sin\left(\frac{2\pi}{T_M} n \Delta t\right), \cos\left(\frac{2\pi}{T_1} n \Delta t\right), \cos\left(\frac{2\pi}{T_2} n \Delta t\right), \ldots, \cos\left(\frac{2\pi}{T_M} n \Delta t\right)\right] \begin{bmatrix} a_1 \\ a_2 \\ \downarrow \\ a_M \\ b_1 \\ b_2 \\ \downarrow \\ b_M \end{bmatrix} \quad (3)$$

$$\underbrace{\begin{bmatrix} y(0) \\ y(1) \\ \vdots \\ y(N) \end{bmatrix}}_{[Y]} = \underbrace{\begin{bmatrix} \sin\left(\frac{2\pi}{T_1} 0\Delta t\right), \sin\left(\frac{2\pi}{T_2} 0\Delta t\right), \ldots \sin\left(\frac{2\pi}{T_M} 0\Delta t\right), \cos\left(\frac{2\pi}{T_1} 0\Delta t\right), \cos\left(\frac{2\pi}{T_2} 0\Delta t\right), \ldots, \cos\left(\frac{2\pi}{T_M} 0\Delta t\right) \\ \sin\left(\frac{2\pi}{T_1} \Delta t\right), \sin\left(\frac{2\pi}{T_2} \Delta t\right), \ldots \sin\left(\frac{2\pi}{T_M} \Delta t\right), \cos\left(\frac{2\pi}{T_1} \Delta t\right), \cos\left(\frac{2\pi}{T_2} \Delta t\right), \ldots \cos\left(\frac{2\pi}{T_M} \Delta t\right) \\ \vdots \\ \sin\left(\frac{2\pi}{T_1} (N)\Delta t\right), \sin\left(\frac{2\pi}{T_2} N\Delta t\right), \ldots \sin\left(\frac{2\pi}{T_M} N\Delta t\right), \cos\left(\frac{2\pi}{T_1} N\Delta t\right), \cos\left(\frac{2\pi}{T_2} N\Delta t\right), \ldots \cos\left(\frac{2\pi}{T_M} N\Delta t\right) \end{bmatrix}}_{[C]} \underbrace{\begin{bmatrix} a_1 \\ a_2 \\ \downarrow \\ a_M \\ b_1 \\ b_2 \\ \downarrow \\ b_M \end{bmatrix}}_{\begin{bmatrix} A \\ B \end{bmatrix}} \quad (4)$$

In Equation (4), there are N time steps and a solution for all the $a_i$ and $b_i$ values can be obtained by the least squares method of pseudoinverse. Equation (4) is important to time domain CTC and hence labels are given to its respective parts. The captured response time record is referred to as the Y vector, the matrix with the sine and cosine terms is called the C matrix, and the matrix with the sine and cosine coefficients is called the A and B Matrix.

Thus, Equation (4) may be rewritten into Equation (5) using this terminology, where:
[Y] is a column vector of length (N+1), also called the time record
[C] is a matrix of size (N+1) by (2M) composed of sines and cosines $$\begin{bmatrix} A \\ B \end{bmatrix}$$

is a column vector of length (2M) where A includes in-phase coefficients and B includes quadrature coefficients:

$$[Y] = [C]\begin{bmatrix} A \\ B \end{bmatrix} \quad (5)$$

To find the in-phase and quadrature components, Equation (5) is solved for the A and B Matrix as shown in Equations (6). Note that C is a constant matrix and therefore the pseudoinverse of C is also a constant matrix. Thus, in Equation (6) the Y matrix represents the sampled RTR.

$$\begin{bmatrix} A \\ B \end{bmatrix} = [[C]^T [C]]^{-1} [C]^T [Y] \quad (6)$$

The time domain CTC technique is applied to find the impedance by stimulating an energy storage device with the ETR and recording the response as the RTR. The C matrix is built using sines and cosines at the known frequencies present in the SOS. Thus, the term $[[C]^T [C]]^{-1} [C]^T$ represents the deviation matrix of coefficients. The Y matrix is the RTR, which represents the current due to the ETR multiplied by the impedance of the battery. The A and B Matrix represent the unknown in-phase and quadrature components of the battery's impedance. As a result, using Equation (6), the deviation matrix is applied to the RTR to determine a discrete impedance spectrum for the energy storage device compensated for crosstalk. The A and B values may then be further processed, for example, to be displayed as a Nyquist plot.

In the time domain CTC solution, the A and B terms taken as pairs, $a_i$, $b_i$ and can be converted into a polar form of magnitude and phase at each frequency based on Equation $$M_i = \sqrt{(a_i)^2 + (b_i)^2}, \quad \phi_i = a\tan\left(\frac{b_i}{a_i}\right) \quad (7)$$

Where: $a_i$, $b_i$ are the real and imaginary parts for the $i^{th}$ frequency
$M_i$, $\phi_i$ are the magnitude and phase parts for the frequency
1.2 Frequency Domain CTC Algorithm The frequency domain CTC algorithm takes the RTR signal in Equation (2), that includes a finite sum-of-sines (SOS) with unknown magnitudes and phases, processes it using constants and parameters associated with the signal (duration, frequencies of interest, etc.), and yields the in-phase and quadrature components of the signal's frequency spectrum at each discrete frequency of interest. The following are derivations used to implement the frequency domain CTC algorithm.

A Discrete Fourier Transform, defined in Equation (8), may be applied to Equation (2) to give the RTR signal in the frequency domain shown in Equation (9). Using Euler and summation identities, Equation (9) can be expanded to the form shown in Equation (10).

$$FT(y(n)) = \sum_{n=-\infty}^{\infty} y(n) e^{-j\omega n} \quad (8)$$

$$FT(y(n)) = \sum_{n=0}^{N-1} \left( \sum_{i=1}^{M} a_i \sin\left(\frac{2\pi}{T_i} n \Delta t\right) + b_i \cos\left(\frac{2\pi}{T_i} n \Delta t\right) \right) e^{-j\omega n} \quad (9)$$

$$Y(\omega) = \sum_{i=1}^{M} \left( \left( \frac{a_i}{2j} + \frac{b_i}{2} \right) \left( \frac{1 - e^{jN\left(\frac{2\pi}{T_i} \Delta t - \omega\right)}}{1 - e^{j\left(\frac{2\pi}{T_i} \Delta t - \omega\right)}} \right) + \left( \frac{b_i}{2} - \frac{a_i}{2j} \right) \left( \frac{1 - e^{-jN\left(\frac{2\pi}{T_i} \Delta t + \omega\right)}}{1 - e^{-j\left(\frac{2\pi}{T_i} \Delta t + \omega\right)}} \right) \right) \quad (10)$$

Equation (10) can then be simplified to Equation (11) by converting the exponential terms to sinc functions.

$$Y(\omega) = \sum_{i=1}^{M} \left( \left( \frac{a_i}{2j} + \frac{b_i}{2} \right) \left( N e^{-j\left(\frac{N-1}{2}\right)\left(\frac{2\pi}{T_i}\Delta t - \omega\right)} \frac{\sinc\left(N\left(\frac{\pi}{T_i}\Delta t - \frac{\omega}{2}\right)\right)}{\sinc\left(\left(\frac{\pi}{T_i}\Delta t - \frac{\omega}{2}\right)\right)} \right) + \left( \frac{b_i}{2} + \frac{a_i}{2j} \right) \left( N e^{-j\left(\frac{N-1}{2}\right)\left(\frac{2\pi}{T_i}\Delta t + \omega\right)} \frac{\sinc\left(N\left(\frac{\pi}{T_i}\Delta t + \frac{\omega}{2}\right)\right)}{\sinc\left(\left(\frac{\pi}{T_i}\Delta t + \frac{\omega}{2}\right)\right)} \right) \right) \quad (11)$$

For synchronous detection in the frequency domain, Equation (11) may be convolved with a discrete Fourier Transform of a sine and a cosine, normalizing to the time record, and evaluating at ω=0. Continuous convolution of a periodic function in frequency may be represented as shown in Equation (12):

$$Y(\omega) = \frac{1}{2\pi} \int_{(2\pi)} x(\zeta) h(\omega - \zeta) d\zeta \quad (12)$$

Applying the convolution expression in Equation (12) to the RTR in Equation (11) relative to the sine and cosine functions yield the expressions shown in Equation (13) and (14).

$$Y(\omega_n)_{sin} = \sum_{i=1}^{M} \left\{ \begin{array}{l} a_i\left(\cos\left(\left(\frac{N-1}{2}\right)\left(\frac{2\pi}{T_i}\Delta t - \omega_n\right)\right)\left(\frac{\text{sinc}\left(N\left(\frac{\pi}{T_i}\Delta t - \frac{\omega_n}{2}\right)\right)}{\text{sinc}\left(\left(\frac{\pi}{T_i}\Delta t - \frac{\omega_n}{2}\right)\right)}\right) - \cos\left(\left(\frac{N-1}{2}\right)\left(\frac{2\pi}{T_i}\Delta t + \omega_n\right)\right)\left(\frac{\text{sinc}\left(N\left(\frac{\pi}{T_i}\Delta t + \frac{\omega_n}{2}\right)\right)}{\text{sinc}\left(\left(\frac{\pi}{T_i}\Delta t + \frac{\omega_n}{2}\right)\right)}\right)\right) + \\ b_i\left(\sin\left(\left(\frac{N-1}{2}\right)\left(\frac{2\pi}{T_i}\Delta t + \omega_n\right)\right)\left(\frac{\text{sinc}\left(N\left(\frac{\pi}{T_i}\Delta t + \frac{\omega_n}{2}\right)\right)}{\text{sinc}\left(\left(\frac{\pi}{T_i}\Delta t + \frac{\omega_n}{2}\right)\right)}\right) - \sin\left(\left(\frac{N-1}{2}\right)\left(\frac{2\pi}{T_i}\Delta t - \omega_n\right)\right)\left(\frac{\text{sinc}\left(N\left(\frac{\pi}{T_i}\Delta t - \frac{\omega_n}{2}\right)\right)}{\text{sinc}\left(\left(\frac{\pi}{T_i}\Delta t - \frac{\omega_n}{2}\right)\right)}\right)\right) \end{array} \right\} \quad (13)$$

$$Y(\omega_n)_{cos} = \sum_{i=1}^{M} \left\{ \begin{array}{l} a_i\left(\sin\left(\left(\frac{N-1}{2}\right)\left(\frac{2\pi}{T_i}\Delta t + \omega_n\right)\right)\left(\frac{\text{sinc}\left(N\left(\frac{\pi}{T_i}\Delta t + \frac{\omega_n}{2}\right)\right)}{\text{sinc}\left(\left(\frac{\pi}{T_i}\Delta t + \frac{\omega_n}{2}\right)\right)}\right) + \sin\left(\left(\frac{N-1}{2}\right)\left(\frac{2\pi}{T_i}\Delta t - \omega_n\right)\right)\left(\frac{\text{sinc}\left(N\left(\frac{\pi}{T_i}\Delta t - \frac{\omega_n}{2}\right)\right)}{\text{sinc}\left(\left(\frac{\pi}{T_i}\Delta t - \frac{\omega_n}{2}\right)\right)}\right)\right) + \\ b_i\left(\cos\left(\left(\frac{N-1}{2}\right)\left(\frac{2\pi}{T_i}\Delta t + \omega_n\right)\right)\left(\frac{\text{sinc}\left(N\left(\frac{\pi}{T_i}\Delta t + \frac{\omega_n}{2}\right)\right)}{\text{sinc}\left(\left(\frac{\pi}{T_i}\Delta t + \frac{\omega_n}{2}\right)\right)}\right) + \cos\left(\left(\frac{N-1}{2}\right)\left(\frac{2\pi}{T_i}\Delta t - \omega_n\right)\right)\left(\frac{\text{sinc}\left(N\left(\frac{\pi}{T_i}\Delta t - \frac{\omega_n}{2}\right)\right)}{\text{sinc}\left(\left(\frac{\pi}{T_i}\Delta t - \frac{\omega_n}{2}\right)\right)}\right)\right) \end{array} \right\} \quad (14)$$

These synchronously detected response signals in Equations (13) and (14) for sine and cosine, respectively, can be simplified as shown in Equations (19) and (20), where the C matrices are as defined in Equations (15) through (18).

Let:

$$C_{a_{ni}\sin} = \cos\left(\left(\frac{N-1}{2}\right)\left(\frac{2\pi}{T_i}\Delta t - \omega_n\right)\right)\left(\frac{\text{sinc}\left(N\left(\frac{\pi}{T_i}\Delta t - \frac{\omega_n}{2}\right)\right)}{\text{sinc}\left(\left(\frac{\pi}{T_i}\Delta t - \frac{\omega_n}{2}\right)\right)}\right) - \cos\left(\left(\frac{N-1}{2}\right)\left(\frac{2\pi}{T_i}\Delta t + \omega_n\right)\right)\left(\frac{\text{sinc}\left(N\left(\frac{\pi}{T_i}\Delta t + \frac{\omega_n}{2}\right)\right)}{\text{sinc}\left(\left(\frac{\pi}{T_i}\Delta t + \frac{\omega_n}{2}\right)\right)}\right) \quad (15)$$

$$C_{b_{ni}\sin} = \sin\left(\left(\frac{N-1}{2}\right)\left(\frac{2\pi}{T_i}\Delta t + \omega_n\right)\right)\left(\frac{\text{sinc}\left(N\left(\frac{\pi}{T_i}\Delta t + \frac{\omega_n}{2}\right)\right)}{\text{sinc}\left(\left(\frac{\pi}{T_i}\Delta t + \frac{\omega_n}{2}\right)\right)}\right) - \sin\left(\left(\frac{N-1}{2}\right)\left(\frac{2\pi}{T_i}\Delta t - \omega_n\right)\right)\left(\frac{\text{sinc}\left(N\left(\frac{\pi}{T_i}\Delta t - \frac{\omega_n}{2}\right)\right)}{\text{sinc}\left(\left(\frac{\pi}{T_i}\Delta t - \frac{\omega_n}{2}\right)\right)}\right) \quad (16)$$

$$C_{a_{ni}\cos} = \sin\left(\left(\frac{N-1}{2}\right)\left(\frac{2\pi}{T_i}\Delta t + \omega_n\right)\right)\left(\frac{\text{sinc}\left(N\left(\frac{\pi}{T_i}\Delta t + \frac{\omega_n}{2}\right)\right)}{\text{sinc}\left(\left(\frac{\pi}{T_i}\Delta t + \frac{\omega_n}{2}\right)\right)}\right) + \sin\left(\left(\frac{N-1}{2}\right)\left(\frac{2\pi}{T_i}\Delta t - \omega_n\right)\right)\left(\frac{\text{sinc}\left(N\left(\frac{\pi}{T_i}\Delta t - \frac{\omega_n}{2}\right)\right)}{\text{sinc}\left(\left(\frac{\pi}{T_i}\Delta t - \frac{\omega_n}{2}\right)\right)}\right) \quad (17)$$

$$C_{b_{ni}\cos} = \cos\left(\left(\frac{N-1}{2}\right)\left(\frac{2\pi}{T_i}\Delta t + \omega_n\right)\right)\left(\frac{\text{sinc}\left(N\left(\frac{\pi}{T_i}\Delta t + \frac{\omega_n}{2}\right)\right)}{\text{sinc}\left(\left(\frac{\pi}{T_i}\Delta t + \frac{\omega_n}{2}\right)\right)}\right) + \cos\left(\left(\frac{N-1}{2}\right)\left(\frac{2\pi}{T_i}\Delta t - \omega_n\right)\right)\left(\frac{\text{sinc}\left(N\left(\frac{\pi}{T_i}\Delta t - \frac{\omega_n}{2}\right)\right)}{\text{sinc}\left(\left(\frac{\pi}{T_i}\Delta t - \frac{\omega_n}{2}\right)\right)}\right) \quad (18)$$

Hence Equations (13) and (14) can be written as:

$$Y(\omega_n)_{sin} = \sum_{i=1}^{M} (a_i C_{a_{ni}\sin} + b_i C_{b_{ni}\sin}) \quad (19)$$

$$Y(\omega_n)_{cos} = \sum_{i=1}^{M} (a_i C_{a_{ni}\cos} + b_i C_{b_{ni}\cos}) \quad (20)$$

Thus, Equations (19) and (20) can be combined in a single matrix equation for a finite M as shown in Equation (21).

$$\underbrace{\begin{bmatrix} Y(\omega_1)_{sin} \\ Y(\omega_2)_{sin} \\ \downarrow \\ Y(\omega_M)_{sin} \\ Y(\omega_1)_{cos} \\ Y(\omega_2)_{cos} \\ \downarrow \\ Y(\omega_M)_{cos} \end{bmatrix}}_{[Y]} = \quad (21)$$

-continued $$\begin{bmatrix} C_{a_{11}sin} & C_{a_{12}sin} & \rightarrow & C_{a_{1M}sin} & C_{b_{11}sin} & C_{b_{12}sin} & \rightarrow & C_{b_{1M}sin} \\ C_{a_{21}sin} & C_{a_{22}sin} & \rightarrow & C_{a_{2M}sin} & C_{b_{21}sin} & C_{b_{22}sin} & \rightarrow & C_{b_{2M}sin} \\ \downarrow & \downarrow & \cdots & \downarrow & \downarrow & \downarrow & \cdots & \downarrow \\ C_{a_{M1}sin} & C_{a_{M2}sin} & \rightarrow & C_{a_{MM}sin} & C_{b_{M1}sin} & C_{b_{M2}sin} & \rightarrow & C_{b_{MM}sin} \\ C_{a_{11}cos} & C_{a_{12}cos} & \rightarrow & C_{a_{1M}cos} & C_{b_{11}cos} & C_{b_{12}cos} & \rightarrow & C_{b_{1M}cos} \\ C_{a_{21}cos} & C_{a_{22}cos} & \rightarrow & C_{a_{2M}cos} & C_{b_{21}cos} & C_{b_{22}cos} & \rightarrow & C_{b_{2M}cos} \\ \downarrow & \downarrow & \cdots & \downarrow & \downarrow & \downarrow & \cdots & \downarrow \\ C_{a_{M1}cos} & C_{a_{M2}cos} & \rightarrow & C_{a_{MM}cos} & C_{b_{M1}cos} & C_{b_{M2}cos} & \rightarrow & C_{b_{MM}cos} \end{bmatrix} \begin{bmatrix} a_1 \\ a_2 \\ \downarrow \\ a_M \\ b_1 \\ b_2 \\ \downarrow \\ b_M \end{bmatrix}$$

$$[C] \quad \begin{bmatrix} A \\ B \end{bmatrix}$$

In Equation (21), the elements in the Y matrix represent the synchronously detected results of the RTR, which is expressed as the matrix multiplication of the deviation matrix, C, and the unknown in-phase and quadrature coefficients in the A and B Matrix. As with the time domain CTC, the C matrix is constant and is derived from the test parameters (duration, frequencies of interest, etc.)

Therefore, Equation (21) can be simplified as shown in Equation (22). If the C matrix is non-singular, the A and B Matrix have the solution shown in Equation (23).

$$[Y] = [C]\begin{bmatrix} A \\ B \end{bmatrix} \quad (22)$$

$$\begin{bmatrix} A \\ B \end{bmatrix} = [C]^{-1}[Y] \quad (23)$$

The frequency domain CTC technique is applied to find impedance of the energy storage device by stimulating the energy storage device with the ETR and recording the response as the RTR. The C matrix and its inverse may be pre-calculated using the number of points in the time record N, the sample rate, and the frequencies of interest such that the deviation matrix is represented by the inverse C matrix. Synchronous detection is performed on the RTR signal to obtain the Y(ω) terms relative to the sine and cosine. At this point, the Y(ω) function includes both the response of interest and the crosstalk error. Using Equation (23), the deviation matrix is applied to the RTR to determine a discrete impedance spectrum compensated for crosstalk by solving for the A and B values. The A and B values are the real and imaginary components, of the ESD that may then be further processed, for example, to be displayed as a Nyquist plot.

In the frequency domain CTC solution, the A and B terms taken as pairs, $a_i$, $b_i$, can be converted into a polar form of magnitude and phase at each frequency based on Equation (7).

2.0 Validation of the CTC Algorithm

Figure 5:
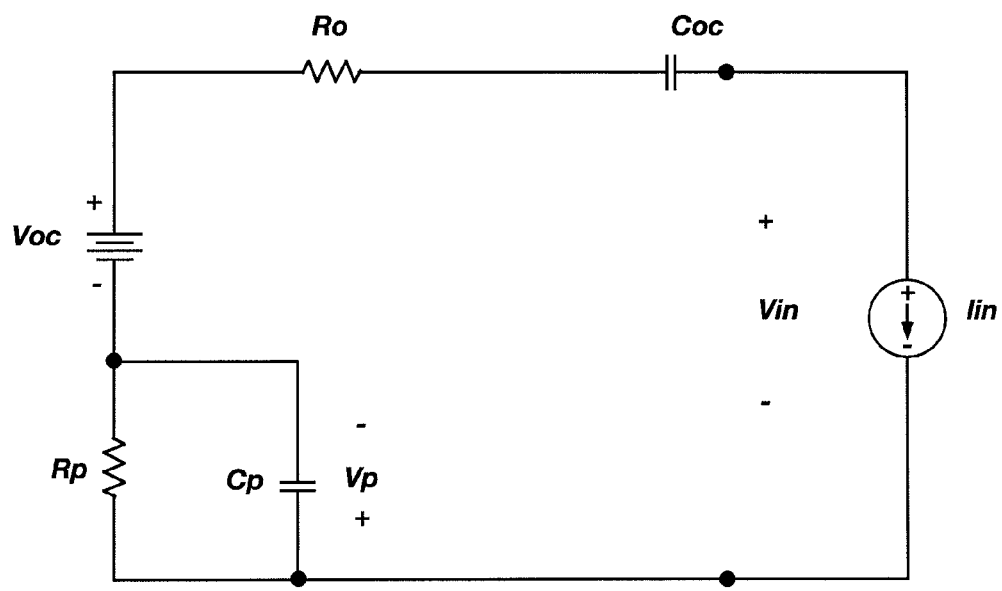
FIG. 5 illustrates a lumped parameter model for use in validating crosstalk compensation (CTC) algorithms.

The time domain CTC and the frequency domain CTC algorithms as defined above have been verified with MATLAB matrix calculation computer software simulations and the Lumped Parameter Model (LPM). The LPM, shown in FIG. 5, is a linear model that is used to predict battery behavior under pulse conditions. However, it is also useful for validating the CTC algorithms since the theoretical response of the LPM, given a known ETR, can be determined and compared to the simulated results.

The theoretical response of the LPM is shown in Equation (24). Selected parameter values representing a typical lithium-ion cell under pulse conditions are shown in Table 1. These data are used in conjunction with Equation (24) to determine the ideal response of an ETR at each frequency of interest within the sum-of-sines signal.

TABLE 1

| LPM Parameters | |
| --- | --- |
| Parameter | Value |
| Voc | 3.8 V |
| Cp | 666.67 F |
| Coc | 1,666.67 F |
| Ro | 0.025 Ω |
| Rp | 0.015 Ω |

$$H(s) = R_0 + \frac{1}{sC_{oc}} + \frac{\left(\frac{R_p}{sC_p}\right)}{\left(R_p + \frac{1}{sC_p}\right)} \quad (24)$$

For these validation studies, the frequencies within the SOS signal will be spread logarithmically between 0.1 Hz and 2,000 Hz. The step size is governed by Equation (25), where M frequencies are selected between the maximum and minimum values ($f_{max}$ and $f_{min}$, respectively).

$$\text{Step Size} = \left(\frac{f_{max}}{f_{min}}\right)^{\left(\frac{1}{M-1}\right)} \quad (25)$$

Figure 6A:
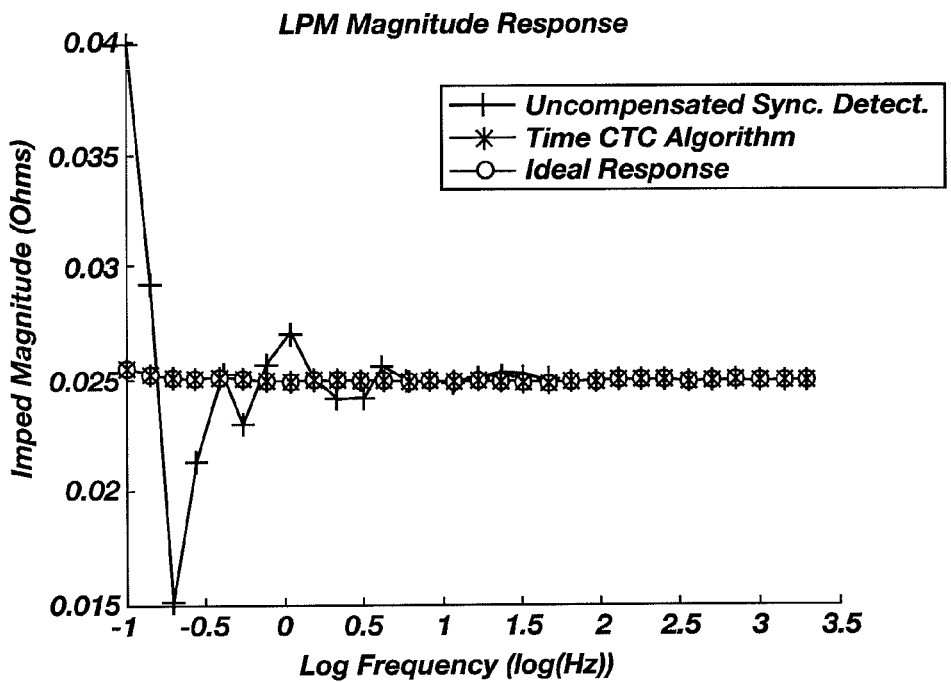
FIGS. 6A and 6B illustrate simulation comparisons between synchronous detection, time domain CTC simulation, and an ideal impedance simulation for a magnitude response and a phase response, respectively.
Figure 6B:
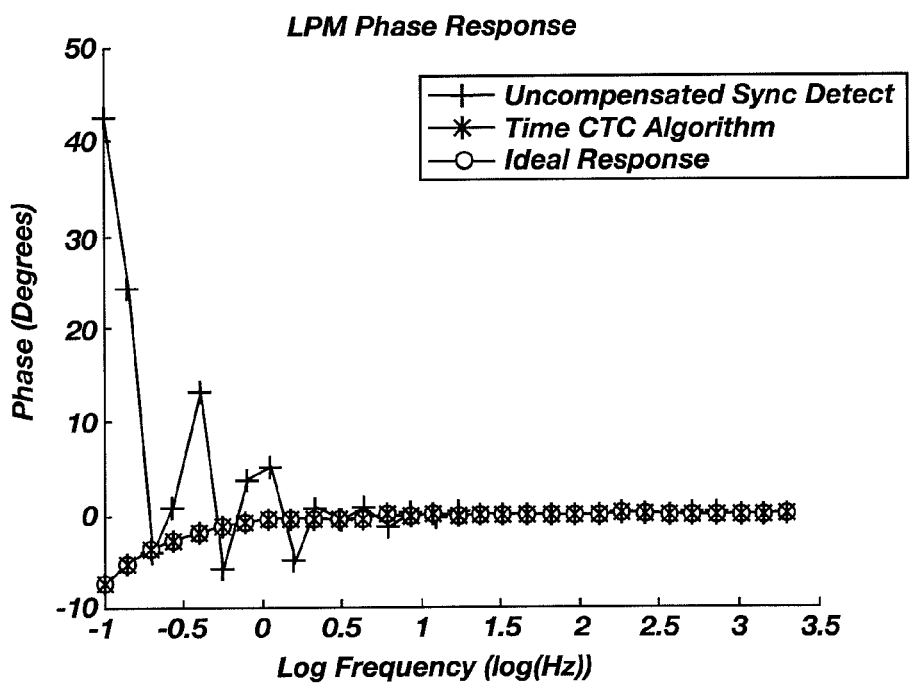

FIGS. 6A and 6B show the magnitude and phase response given an ETR with a sum-of-sines including 30 frequencies (i.e., M=30 and the step size is 1.41). The ideal response of the LPM based on Equation (24) is shown in the open circles. Assuming no deviation matrix were available, the synchronously detected results from the recursively solved voltage response of the LPM is given by the "+" symbols. As shown, the uncompensated results do well at high frequencies, but get significantly worse as the frequency within the SOS is reduced. When the deviation matrix is included, the Time CTC synchronously detected results, shown with the "*" symbol, yield significant improvement at the lower frequencies. Thus, the crosstalk error with 30 frequencies is successfully eliminated with the CTC approach.

Figure 7A:
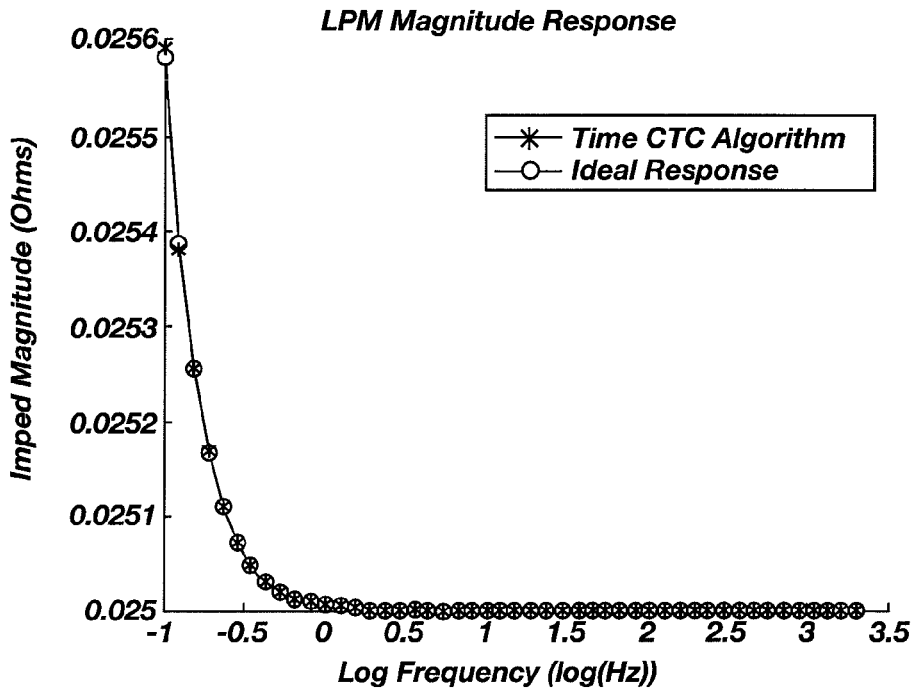
FIGS. 7A and 7B illustrate simulation comparisons of magnitude response and phase response, respectively, for time domain CTC simulation and an ideal impedance simulation using 48 frequencies.
Figure 7B:
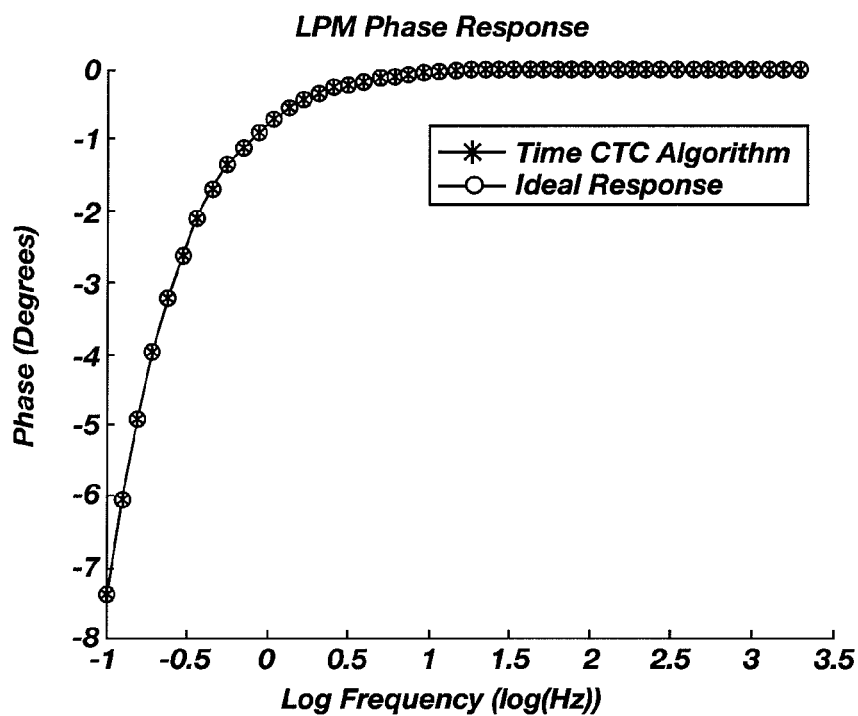

FIGS. 7A and 7B illustrate the magnitude and phase of the time domain CTC response given 48 frequencies. These data are also compared to the theoretical response of the LPM given Equation (24). As shown, the CTC methodology is still able to successfully resolve the impedance spectra with a step factor as low as 1.23.

Figure 8A:
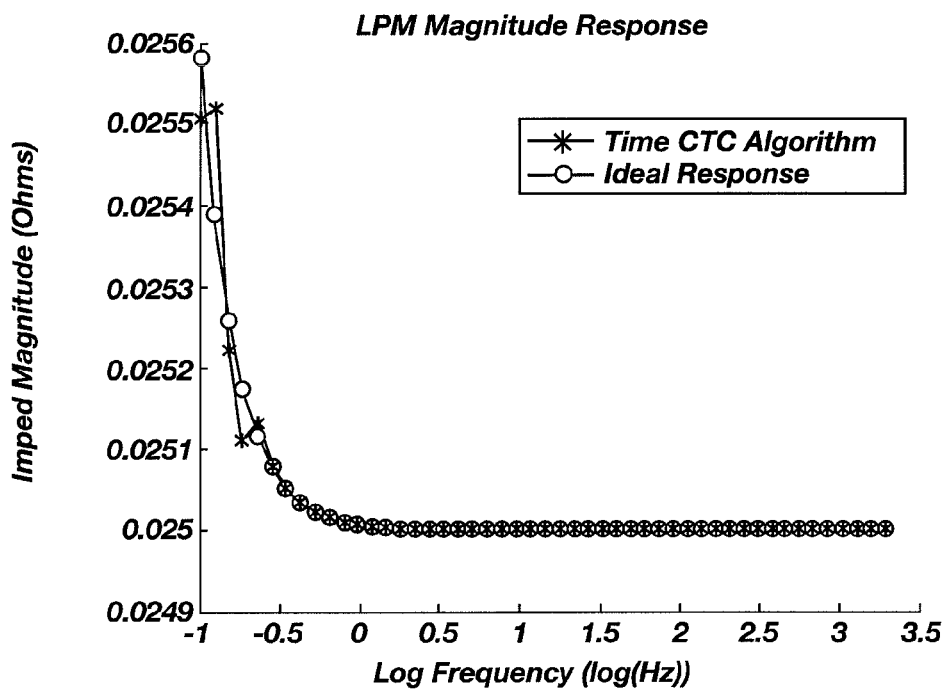
FIGS. 8A and 8B illustrate simulation comparisons of magnitude response and phase response, respectively, for time domain CTC simulation and an ideal impedance simulation using 49 frequencies.
Figure 8B:
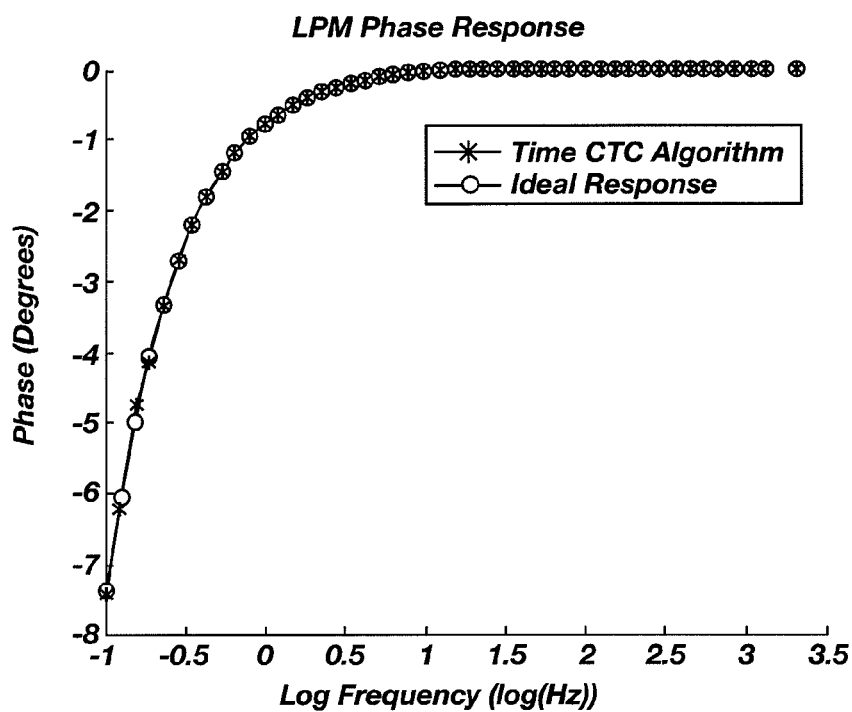

FIGS. 8A and 8B illustrate the magnitude and phase of the time domain CTC response given 49 frequencies. These data are also compared to the theoretical response of the LPM given Equation (24). As shown, some errors at low frequency begin to appear in the CTC methodology in this case. This indicates that error terms can increase with smaller step factors.

An error metric between the ideal response of the LPM and the time domain CTC simulation results can be defined as shown in Equation (26). Table 2 provides the error metric value for the magnitude, phase, real, and imaginary components given an increasing number of frequencies within the SOS input signal (M=45, 46, 47, 48, and 49). As shown, the error increases when more frequencies are included, and generally jumped more than an order of magnitude between M=48 and M=49.

$$\text{Maximum Single Error} = \max(|\text{TimeCTC} - \text{Ideal}|) \quad (26)$$

TABLE 2

Time CTC Maximum Single Error for Different Numbers of Frequencies

|  | M = 45 | M = 46 | M = 47 | M = 48 | M = 49 |
| --- | --- | --- | --- | --- | --- |
| Mag. Err | 3.8223e−008 | 1.4819e−006 | 5.7584e−007 | 7.3563e−006 | 1.3004e−004 |
| Phase Err | 8.9992e−005 | 0.0043 | 0.0024 | 0.0194 | 0.2157 |
| Real Err | 3.5676e−008 | 1.3544e−006 | 6.6492e−007 | 7.4177e−006 | 1.2314e−004 |
| Imag. Err | 3.9899e−008 | 1.8650e−006 | 1.0144e−006 | 8.4383e−006 | 9.7847e−005 |

A similar effect was observed when assessing the RTR using the frequency domain CTC approach. Table 3 provides the error metric value based on Equation (26) for the magnitude, phase, real, and imaginary components given an increasing number of frequencies within the SOS input signal. The error terms in the frequency domain are slightly larger than the Time CTC and this may be due to rounding errors caused by increased computational requirements for frequency domain CTC. As with time domain CTC, however, the error metric significantly increases between M=48 and M=49. Nevertheless, the error term with 49 frequencies within a SOS excitation signal is still relatively low and yields a very high resolution impedance spectrum within one period of the lowest frequency for state-of-health assessment.

TABLE 3

Frequency CTC Maximum Single Error for Different Numbers of Frequencies

|  | M = 45 | M = 46 | M = 47 | M = 48 | M = 49 |
| --- | --- | --- | --- | --- | --- |
| Mag. Err | 1.3017e−007 | 3.1605e−006 | 8.0059e−006 | 5.2176e−005 | 1.3420e−004 |
| Phase Err | 4.2931e−004 | 0.0090 | 0.0189 | 0.1512 | 0.3319 |
| Real Err | 1.1515e−007 | 2.8842e−006 | 7.4597e−006 | 4.8384e−005 | 1.2433e−004 |
| Imag. Err | 1.8504e−007 | 3.9234e−006 | 8.2796e−006 | 6.6541e−005 | 1.4705e−004 |

2.1 Half Period Simulation

Since CTC is not limited by harmonically related frequencies within the SOS excitation signal, one significant advantage is that it is not limited to one period of the lowest frequency to complete the measurement. Faster measurements can be achieved at the expense of resolution in the impedance spectrum measurement. For example, it is possible with CTC to measure the impedance spectrum within the range of 0.1 Hz to 2,000 Hz within a half period of the lowest frequency (i.e., a 5-s measurement).

Figure 9A:
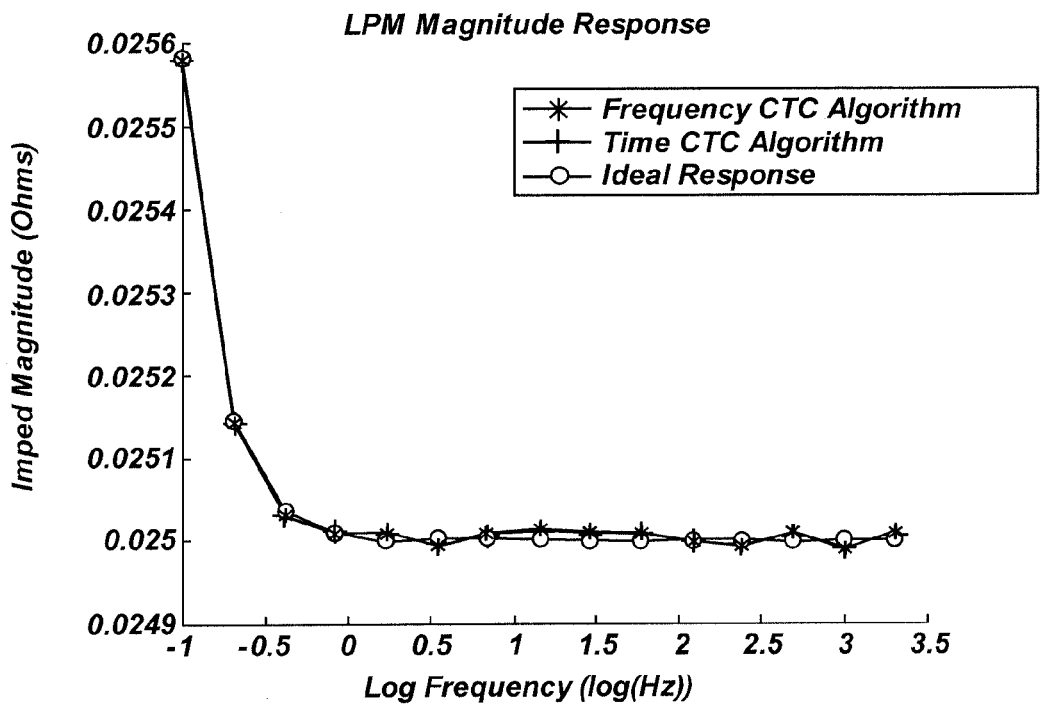
FIGS. 9A and 9B illustrate half-period simulations for the time domain CTC, frequency domain CTC, and an ideal impedance simulation for a magnitude response and a phase response, respectively.
Figure 9B:
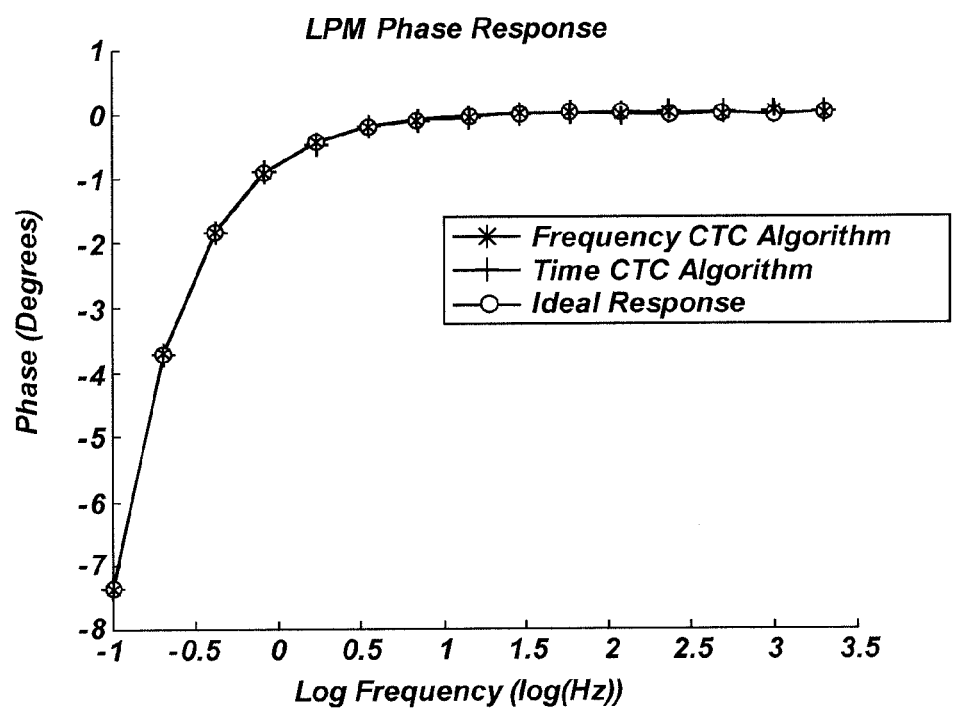

FIGS. 9A and 9B illustrate half-period simulations for the time domain CTC, frequency domain CTC, and an ideal impedance simulation for a magnitude response and a phase response, respectively. Notice that reducing the duration of testing reduces the number of frequencies that can be fit in a given range (M=15 in this case). However, the CTC algorithms still closely match the ideal impedance simulations. As a result, a SOS using one-half the period of the lowest frequency can still yield good results if a decrease in frequency resolution is acceptable.

Of course, other fractions less that the duration of the lowest frequency may also be used.

While the invention is susceptible to various modifications and implementation in alternative forms, specific embodiments have been shown by way of non-limiting examples in the drawings and have been described in detail herein. However, it should be understood that the invention is not intended to be limited to the particular forms disclosed. Rather, the invention includes all modifications, equivalents, and alternatives falling within the scope of the following appended claims and their legal equivalents.

What is claimed is:

1. A method of estimating an impedance of an energy storage device, comprising:
generating two or more input signals at different frequencies with a frequency step factor therebetween;
generating an excitation time record comprising a summation of the two or more input signals;
generating a deviation matrix of coefficients relative to parameters of the excitation time record to determine crosstalk between the two or more input signals;
stimulating an energy storage device with a signal generator applying the excitation time record and capturing a response time record indicative of a response of the energy storage device to the excitation time record with a response measurement device; and
applying the deviation matrix of coefficients to the response time record to remove the crosstalk and determine response signals including an in-phase component and a quadrature component of the impedance of the energy storage device at each of the different frequencies.

2. The method of claim 1, wherein generating two or more input signals comprises generating sinusoidal signals.

3. The method of claim 1, wherein generating two or more input signals comprises generating non-harmonic signals.

4. The method of claim 1, wherein generating two or more input signals comprises generating harmonic signals.

5. The method of claim 1, further comprising generating a magnitude and a phase for each of the different frequencies to determine a frequency response of the energy storage device.

6. The method of claim 1, wherein generating the deviation matrix of coefficients further comprises performing a time domain analysis by developing a least squares solution for each frequency in the summation of the two or more input signals with a pseudoinverse matrix for N time steps wherein there are N+1 samples in the response time record.

7. The method of claim 1, wherein generating the deviation matrix of coefficients further comprises performing a frequency domain analysis by:
generating a synchronously detected response time record for each frequency in the summation of the two or more input signals;
generating a discrete Fourier transform of the response time record for each frequency in the summation of the two or more input signals;
convolving the response time record in the frequency domain for each frequency in the summation of the two or more input signals;
normalizing the discrete Fourier transform of the convolved response time record to one-half the number of samples in the response time record; and
evaluating the normalized discrete Fourier transform of the convolved response time record at zero frequency;
wherein generating the deviation matrix of coefficients relative to the response time record further comprises combining the normalized discrete Fourier transform of the convolved response and the synchronously detected response time record for each frequency in the summation of the two or more input signals to form the deviation matrix of coefficients.

8. The method of claim 1, further comprising conditioning the excitation time record to be compatible with measurement conditions of the energy storage device.

9. The method of claim 1, wherein the two or more input signals are a series of frequencies comprising a lowest frequency and each additional frequency in the series of frequencies is the frequency step factor higher than a previous frequency in the series of frequencies.

10. The method of claim 9, wherein generating the excitation time record comprises generating the excitation time record to have a duration of about a period of the lowest frequency.

11. The method of claim 9, wherein generating the excitation time record comprises generating the excitation time record to have a duration of about one-half the period of the lowest frequency.

12. The method of claim 9, wherein generating the excitation time record comprises generating the excitation time record to have a duration less than the period of the lowest frequency.

13. The method of claim 1, further comprising augmenting the deviation matrix of coefficients with noise information within the energy storage device, a system coupled to the energy storage device, or a combination thereof, and wherein applying the deviation matrix of coefficients to the response time record also removes the noise information from the response signals.

14. An apparatus for characterizing an energy storage device, comprising:
a signal generator configured for stimulating an energy storage device with a stimulus signal generated responsive to an excitation time record;
a response measurement device configured for measuring a response signal when the stimulus signal is applied to the energy storage device, the response signal indicative of a response of the energy storage device to the stimulus signal; and
an analyzer operably coupled to the stimulus signal and the response signal, the analyzer configured for:
generating two or more input signals at different frequencies with a frequency step factor therebetween;
generating the excitation time record comprising a summation of the two or more input signals;
generating a deviation matrix of coefficients relative to parameters of the excitation time record to determine a crosstalk between the two or more input signals;
sampling the response signal to generate a response time record; and
applying the deviation matrix of coefficients to the response time record to remove the crosstalk and determine response signals including an in-phase component and a quadrature component of the impedance of the energy storage device at each of the different frequencies.

15. The apparatus of claim 14, wherein the analyzer is further configured for generating the two or more input signals as sinusoidal signals.

16. The apparatus of claim 14, wherein the analyzer is further configured for generating the two or more input signals as non-harmonic signals.

17. The apparatus of claim 14, wherein the analyzer is further configured for generating the two or more input signals as harmonic signals.

18. The apparatus of claim 14, wherein the analyzer is further configured for generating a magnitude and a phase for each of the different frequencies to determine a frequency response of the energy storage device.

19. The apparatus of claim 14, wherein the analyzer is further configured for generating the deviation matrix of coefficients by performing a time domain analysis to develop a least squares solution for equations for each frequency in the summation of the two or more input signals with a pseudoinverse matrix for N time steps wherein there are N+1 samples in the response time record.

20. The apparatus of claim 14, wherein the analyzer is further configured for generating the deviation matrix of coefficients by performing a frequency domain analysis, comprising:
generating a synchronously detected response time record for each frequency in the summation of the two or more input signals;
generating a discrete Fourier transform of the response time record for each frequency in the summation of the two or more input signals;
convolving the response time record in the frequency domain for each frequency in the summation of the two or more input signals;
normalizing the discrete Fourier transform of the convolved response time record to one-half the number of samples in the response time record; and
evaluating the normalized discrete Fourier transform of the convolved response time record at zero frequency;
wherein generating the deviation matrix of coefficients relative to the response time record further comprises combining the normalized discrete Fourier transform of the convolved response and the synchronously detected response time record for each frequency in the summation of the two or more input signals to form the deviation matrix of coefficients.

21. The apparatus of claim 14, wherein the analyzer is further configured for conditioning the excitation time record to be compatible with measurement conditions of the energy storage device.

22. The apparatus of claim 14, wherein the two or more input signals are a series of frequencies comprising a lowest frequency and each additional frequency in the series of frequencies is the frequency step factor higher than a previous frequency in the series of frequencies.

23. The apparatus of claim 22, wherein the analyzer is further configured for generating the excitation time record by generating the excitation time record to have a duration of about a period of the lowest frequency.

24. The apparatus of claim 22, wherein the analyzer is further configured for generating the excitation time record by generating the excitation time record to have a duration less than the period of the lowest frequency.

25. The apparatus of claim 14, wherein the analyzer is further configured for augmenting the deviation matrix of coefficients with noise information within the energy storage device, a system coupled to the energy storage device, or a combination thereof, and wherein applying the deviation matrix of coefficients to the response time record also removes the noise information from the response signals.

26. Non-transitory computer-readable media including computer-executable instructions, which when executed on one or more computers, cause the computers to:
  generate two or more input signals at different frequencies with a frequency step factor therebetween;
  generate an excitation time record comprising a summation of the two or more input signals;
  generate a deviation matrix of coefficients relative to parameters of the excitation time record to determine a crosstalk between the two or more input signals;
  stimulate an energy storage device with the excitation time record and capture a response time record indicative of a response of the energy storage device to the excitation time record; and
  applying the deviation matrix of coefficients to the response time record to remove the crosstalk and determine response signals including an in-phase component of an impedance of the energy storage device and a quadrature component of the impedance of the energy storage device at each of the different frequencies.

27. The non-transitory computer-readable media of claim 26, wherein the computer instructions are further configured to generate two or more input signals as non-harmonic sinusoidal signals.

28. The non-transitory computer-readable media of claim 26, wherein the computer instructions are further configured to cause the computer to generate a magnitude and a phase for each of the different frequencies to determine a frequency response of the energy storage device.

29. The non-transitory computer-readable media of claim 26, wherein the computer instructions configured to cause the computer to generate the deviation matrix of coefficients are further configured to cause the computer to perform a time domain analysis by developing a least squares solution for each frequency in the summation of the two or more input signals with a pseudoinverse matrix for N time steps wherein there are N+1 samples in the response time record.

30. The non-transitory computer-readable media of claim 26, wherein the computer instructions configured to cause the computer to generate the deviation matrix of coefficients are further configured to cause the computer to perform a frequency domain analysis by:
  generating a synchronously detected response time record for each frequency in the summation of the two or more input signals;
  generating a discrete Fourier transform of the response time record for each frequency in the summation of the two or more input signals;
  convolving the response time record in the frequency domain for each frequency in the summation of the two or more input signals;
  normalizing the discrete Fourier transform of the convolved response time record to one-half the number of samples in the response time record; and
  evaluating the normalized discrete Fourier transform of the convolved response time record at zero frequency;
  wherein generating the deviation matrix of coefficients relative to the response time record further comprises combining the normalized discrete Fourier transform of the convolved response and the synchronously detected response time record for each frequency in the summation of the two or more input signals to form the deviation matrix of coefficients.

31. The non-transitory computer-readable media of claim 26, wherein the two or more input signals comprise input signals at a series of frequencies comprising a lowest frequency and each additional frequency in the series of frequencies is the frequency step higher than the previous frequency in the series of frequencies.

32. The non-transitory computer-readable media of claim 31, wherein the computer instructions configured to generate the excitation time record are further configured to generate the excitation time record to have a duration of about a period of the lowest frequency.

33. The non-transitory computer-readable media of claim 31, wherein the computer instructions configured to generate the excitation time record are further configured to generate the excitation time record to have a duration less than the period of the lowest frequency.

34. The non-transitory computer-readable media of claim 26, wherein the computer instructions are further configured to augment the deviation matrix of coefficients with noise information within the energy storage device, a system coupled to the energy storage device, or a combination thereof, and wherein applying the deviation matrix of coefficients to the response time record also removes the noise information from the response signals.

* * * * *